United States Patent [19]

Buzak

[11] Patent Number: 5,036,317
[45] Date of Patent: Jul. 30, 1991

[54] FLAT PANEL APPARATUS FOR ADDRESSING OPTICAL DATA STORAGE LOCATIONS

[75] Inventor: Thomas S. Buzak, Beaverton, Oreg.

[73] Assignee: Tektronix, Inc., Beaverton, Oreg.

[21] Appl. No.: 234,774

[22] Filed: Aug. 22, 1988

[51] Int. Cl.[5] .......................... G09G 3/34; Q11C 11/42
[52] U.S. Cl. .................................... 340/783; 340/799; 350/334; 365/112; 365/118
[58] Field of Search ............... 340/783, 784, 771, 799, 340/750, 760, 772, 775, 794; 350/331 R, 334; 365/106, 112, 118, 128

[56] References Cited

U.S. PATENT DOCUMENTS

| | | | |
|---|---|---|---|
| 4,499,458 | 2/1985 | Le Berre et al. | 340/783 |
| 4,742,345 | 5/1988 | DiSanto et al. | 340/783 |
| 4,744,636 | 5/1988 | Haven et al. | 350/331 R |
| 4,784,883 | 11/1988 | Chitwood et al. | 350/334 |
| 4,864,538 | 9/1989 | Buzak | 340/799 |
| 4,884,874 | 12/1989 | Buzak et al. | 350/331 R |
| 4,896,149 | 1/1990 | Buzak et al. | 340/771 |

OTHER PUBLICATIONS

Farrayre et al., "Geometrical Resolution Improvement of Sodern Visualization System", SID 85 Digest, 266–269.

Lamport et al., "The Channel Electron Multiplier CRT: Flat Deflection System," SID 82 Digest, 210–211.

*Primary Examiner*—Ulysses Weldon
*Assistant Examiner*—M. Fatahi-yar
*Attorney, Agent, or Firm*—John D. Winkelman; Mark M. Meininger

[57] ABSTRACT

A flat panel apparatus for and a method of addressing data storage locations (80) employs a row-scanning electron beam (76) to address simultaneously a row (120) of such storage locations and thereby store data in and read data out of them. The storage locations are defined by the overlapping areas of multiple column electrodes (62) extending in a common direction on a first substrate (82) and rows addressed by the electron beam and extending in a common direction on a second substrate (54). A layer of dielectric material (52) separate the first and the second substrates, which are positioned face-to-face and spaced-apart with the direction of the addressed rows transverse to that of the column electrodes. The column electrodes receive data drive signals. The addressing apparatus is configured so that for each storage location secondary electrons emitted by the electron beam striking the location function as an electrical switch that changes between a conducting state and a nonconducting state in response to the presence of the electron beam. The secondary electrons function to either store data in or read data out of the storage location. If the storage location includes a layer (52) of material having electro-optic properties and receives incident image-carrying light, the secondary electrons function to select and store image data across the layer and thereby provide a display system having gray scale luminance.

24 Claims, 7 Drawing Sheets

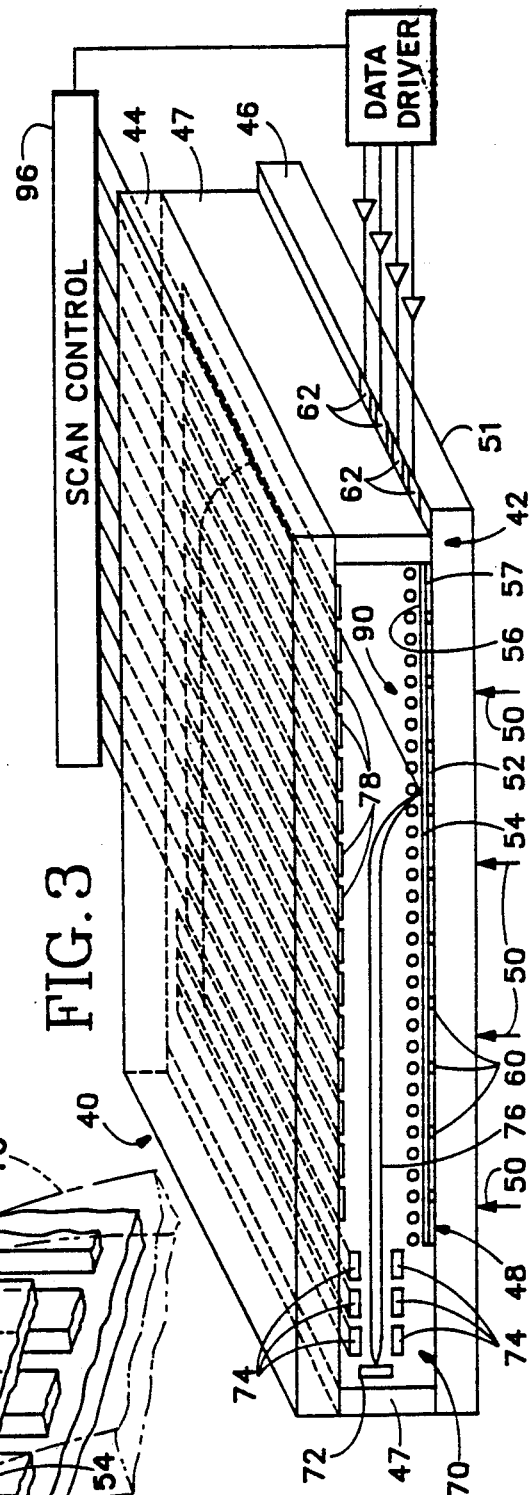
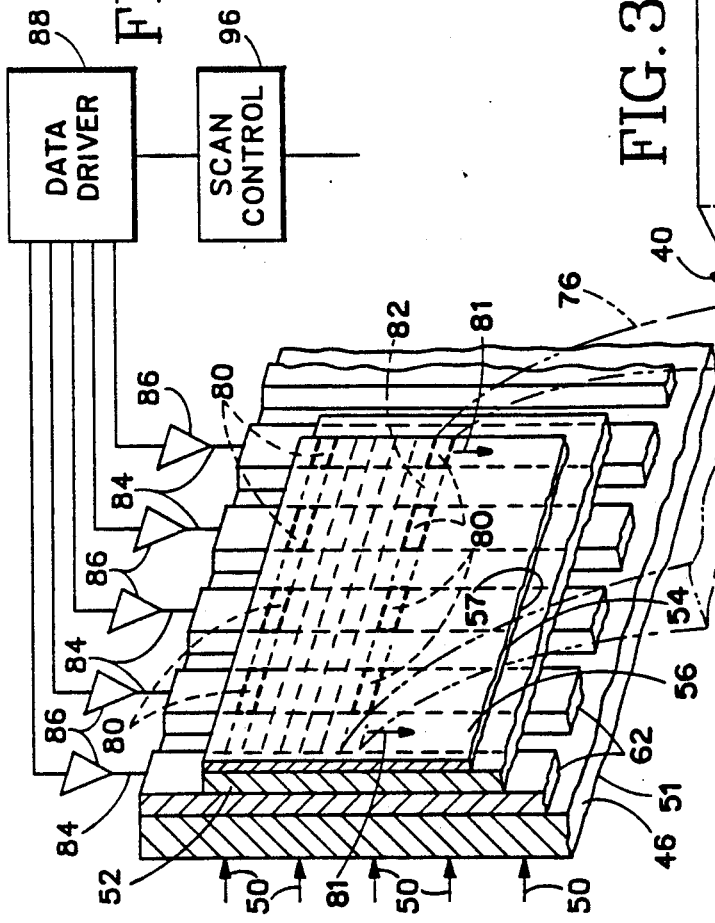

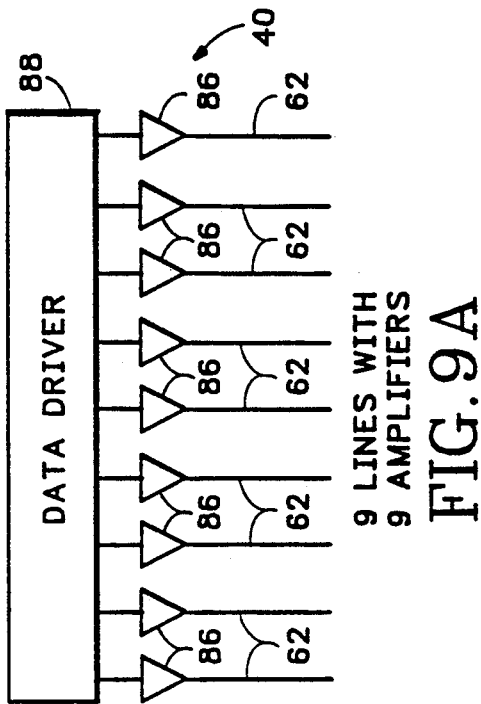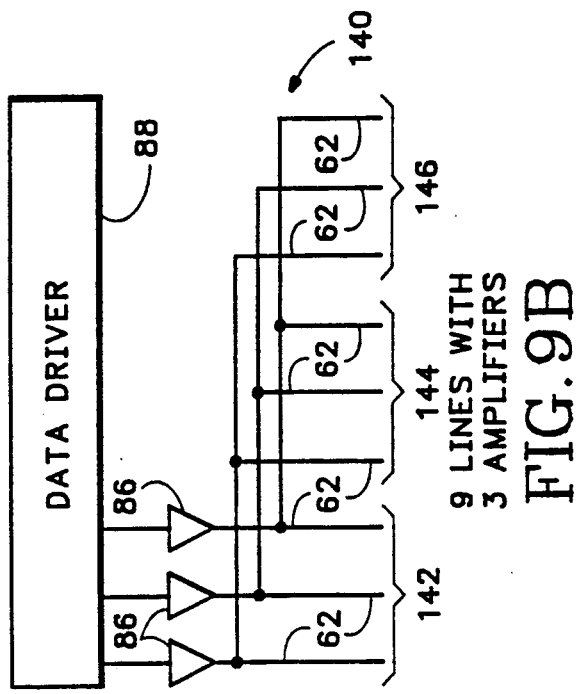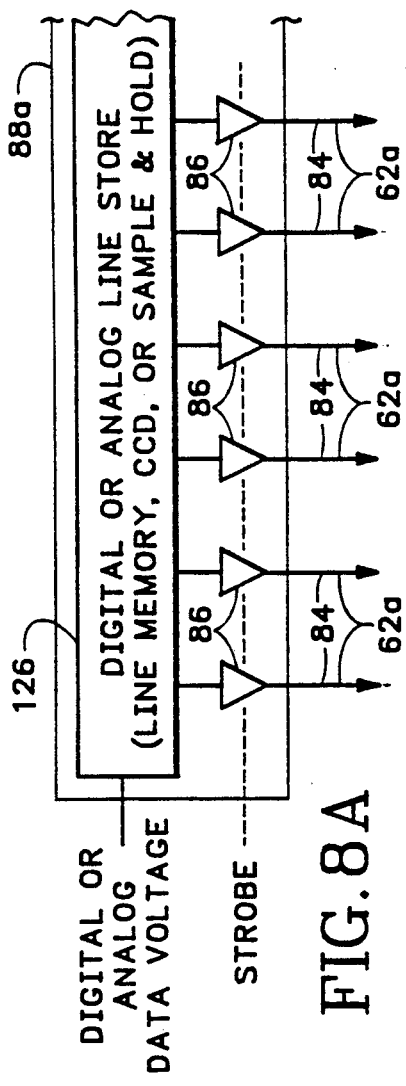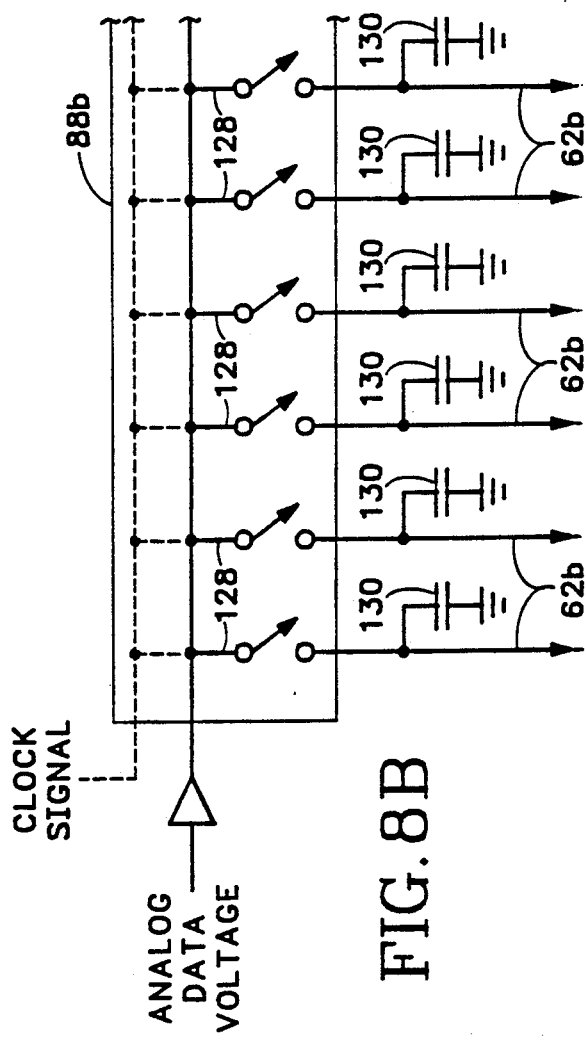

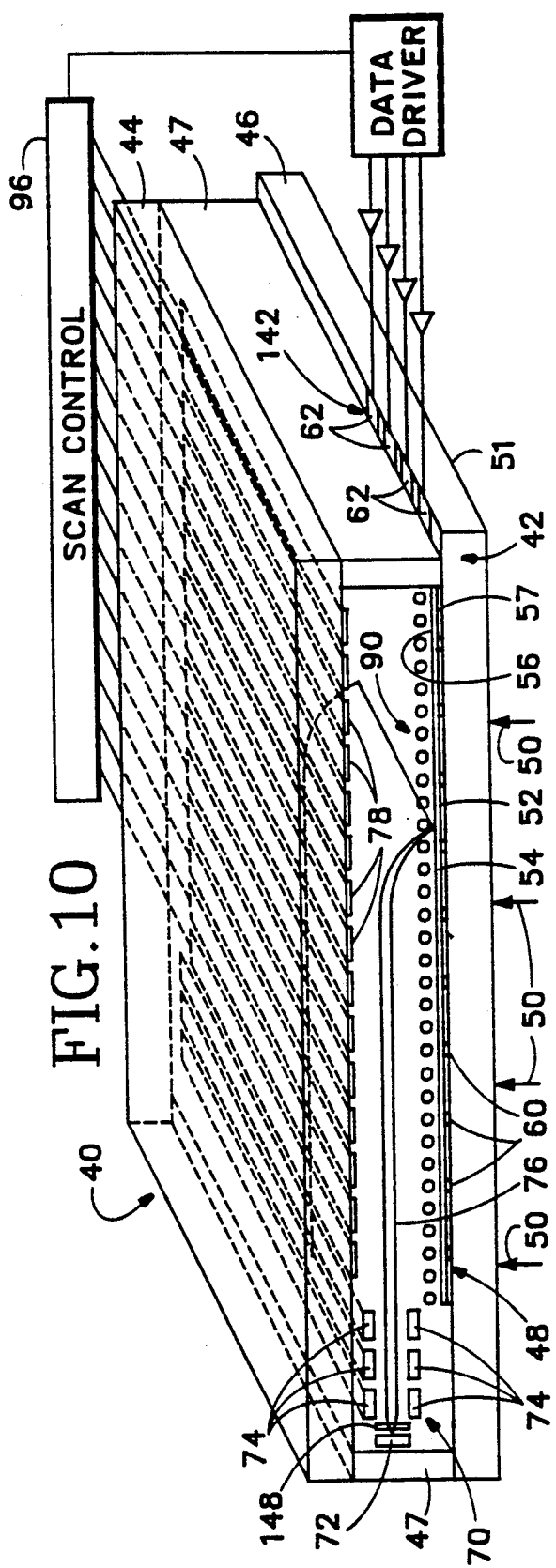

FLAT PANEL APPARATUS FOR ADDRESSING OPTICAL DATA STORAGE LOCATIONS

TECHNICAL FIELD

The present invention relates to systems having multiple optical data storage locations and, in particular, to a flat panel apparatus in which a row-scanning electron beam and surface electrodes carrying applied optical data signals cooperate to address an array of such storage locations.

BACKGROUND OF THE INVENTION

Systems employing optical data storage locations include, for example, video cameras and image displays. Such systems employ an addressing structure that provides data to or retrieves data from the storage locations. One system of this type is a general purpose flat panel display, whose storage or display locations store light pattern data. A flat panel display comprises multiple display locations distributed throughout the viewing area of a display surface.

One type of flat panel display system employs a matrix-type addressing structure that accomplishes direct multiplexing of multiple liquid crystal cells that are arranged in an array and function as the display locations. Each of the liquid crystal cells is positioned between a pair of electrical conductors that selectively apply select and deselect voltage signals across the liquid crystal cell to change its optical properties and thereby change the brightness of the image it develops. A display system of this type is characterized as "passive" because no "active" electronic device cooperates with the liquid crystal cell to modify its electro-optical properties. Such a display system suffers from the disadvantage of being capable of implementation in only a low resolution display application having a limited number of addressable lines (i.e., up to about 250) of video information or data for developing a display image. Such a display system may also suffer from the disadvantages of providing limited gray scale, relatively low image contrast, and a small range of viewing angles.

Another type of flat panel display system having a matrix-type addressing structure employs an array of electrically "active" elements that act as electronic switches at each of the display locations. Such a display system may employ, for example, thin film transistors (TFT) having nonlinear signal processing characteristics that cooperate with the liquid crystal material to provide a full gray scale capability. Such a display system is capable of providing high resolution displays, good image contrast, and relatively wide range of viewing angles. A display system of this type suffers, however, from the disadvantage of being very difficult to fabricate with high production yields because of the large number of electronic elements and data drivers required in such a system. For example, a 1,000 line full color display system of this type could require up to about 3 million electronic elements and about 4,000 data drivers.

Yet another type of flat panel display system is characterized as a flat cathode-ray tube. Such a display system is described in Lamport et al., "The Channel Electron Multiplier CRT: Flat Deflection System," *SID* 82 *Digest.* 210–211.

FIGS. 1 and 2 are respective cross sectional and frontal views of a flat cathode-ray tube display system 10 of the type described by Lamport et al. Display system 10 includes an electron gun 12 centrally positioned at the bottom of a back side 14 (FIG. 1) of the display system. Electron gun 12 generates a conventional cylindrical electron beam 16 that is shown propogating along multiple exemplary beam paths. The beam current of electron beam 16 changes in response to luminance information carried by image data or information developed by display system 10.

Electron gun 12 directs beam 16 upwardly in a y-axis direction along back side 14 to a trough-shaped reversing lens 18, which directs the beam around the upper end of a central plate 20 and downwardly in the y-axis direction along a front side 22 of the display system. Electron beam 16 is deflected in an x-axis direction (out of the plane of the page in FIG. 1) by a pair of conventional deflection plates 24 positioned near electron gun 12. Electron beam 16 is deflected in a z-axis direction (out of the plane of the page in FIG. 2) and strikes a display screen 26 successively at different locations spaced apart by a predetermined distance in the y-axis direction. This is accomplished by successively applying voltages of appropriate character to corresponding ones of multiple frame deflection plates 28 that extend in the x-axis direction across the front surface of central plate 20. Display screen 26 includes a channel electron multiplier 30 that receives the deflected electron beam 16 and delivers an increased number of electrons to a fluorescent screen 32 to form on screen 32 a display image corresponding to the image information carried by electron beam 16.

In operation, electron beam 16 is deflected in the x-axis direction by deflection plates 24 to form horizontal scan lines that extend in the x-axis direction across display screen 26. Electron beam 16 is deflected onto display screen 26 at different positions along the y-axis direction by successively switching different ones of the frame deflection plates 28 between a cathode potential of zero volts and an anode potential of about +400 volts, thereby to effect a scanning of different horizontal lines. Accordingly, deflection plates 24 and frame deflection plates 28 cooperate to scan the information-carrying electron beam 16 across display screen 26 in a raster pattern. Electron beam 16 and deflection plates 24 and 28 function, therefore, as an addressing structure for addressing each one of multiple picture elements on display screen 26.

The resolution of display system 10 is determined by the spot size and, therefore, the focusing of electron beam 16 on display screen 26. The electric fields generated by frame deflection plates 28 cooperate to focus electron beam 16 in the y-axis direction as the beam strikes display screen 26, thereby providing display system 10 with relatively high resolution qualities in the y-axis direction. Electron beam 16 is focused in the x-axis direction, however, by means of focusing electrodes included in electron gun 12. Such focusing electrodes are disadvantageous because they are of relatively complex design to compensate for the extreme differences in the electron beam path length at the top and bottom of display screen 26. Display system 10 also suffers from the disadvantage of positioning electron beam 14 in raster scan fashion, which requires that both back side 14 and front side 22 provide electron beam paths of sufficient lengths to scan electron beam 16 over the entire surface of display screen 26. This is disadvantageous because sides 14 and 22 make display system 10 relatively thick and require the reversing lens 18 to direct beam 16 around the end of central plate 20. Increased thickness is an undesirable characteristic of a flat panel display, and reversing lens 18 can degrade the focus of beam 16 in the x-axis direction.

SUMMARY OF THE INVENTION

An object of the present invention is, therefore, to provide a flat panel system in which a row-scanning electron beam and multiple display surface electrodes carrying applied optical data signals cooperate to form an addressing structure.

Another object of this invention is to provide such a system that is capable of being implemented in a display apparatus to provide it with a wide range of viewing angles, high resolution, full gray scale, and good image contrast properties.

A further object of this invention is to provide such a system in which the resolution of the addressing structure is substantially independent of the focusing effects of the beam-emitting electron gun.

Still another object of this invention is to provide such a system that does not position the electron beam in raster scan fashion.

Yet another object of this invention is to provide such a system that is comparatively thin.

The present invention relates to a flat panel apparatus for addressing data storage locations. The invention is described herein only by way of example with reference to two embodiments relating to a high resolution display system and a memory device.

The first embodiment comprises an addressing structure implemented in a relatively thin, high resolution flat panel display system that can be used in either direct view or projection applications. The display system includes a display surface formed of an array of rows and columns of data storage or display locations. The display locations comprise an electrooptic material, such as a nematic liquid crystal, that is positioned between multiple optically transparent electrical conductors that define columns of display locations and a dielectric substrate that is addressed by a row-scanning electron beam capable of simultaneously addressing all column positions of display locations in a row. The electro-optic material cooperates with the electrical conductors and the electron beam-addressed dielectric substrate to intensity modulate externally generated light propagating through the display locations.

The second embodiment comprises an addressing structure implemented as part of a flat panel memory device into which and out of which analog information can be, respectively, electronically written or electronically read. The memory device includes an array of rows and columns of data storage or memory locations. The memory locations comprise a dielectric material, such as glass, plastic, or photoconductor, that has multiple electrical conductors extending as columns across a first major surface and is addressed on a second major surface by a row-scanning electron beam capable of simultaneously addressing a stripe region that includes all column positions of memory locations in a row. The electron beam and the multiple electrical conductors cooperate to provide a way of addressing a memory location to read out a signal previously developed across the memory location, irrespective of the manner in which it acquired the signal.

In the first embodiment, a row represents one line of video information or data, and in the second embodiment, a row represents a set of discrete quantities of analog information or data. (The information addressed in either embodiment is hereafter referred to as "data.") The multiple electrical conductors are arranged in columns and receive the data, and an electron beam of constant current and a width substantially equal to that of the dielectric substrate is scanned along the length of the dielectric substrate to address all of the columns row by row in a row scan fashion.

In particular, either the display panel of the first embodiment or the memory device of the second embodiment comprises first and second spaced-apart substrates positioned face-to-face to each other. Multiple nonoverlapping electrical conductors extending generally in a first direction along the inner surface of the first substrate form column electrodes for data drive signals applied to them. A row-scanning electron beam is directed in the first direction along a path substantially parallel to an outer or target surface of the second substrate.

The electron beam is deflected to strike the target surface successively at different locations spaced apart by a predetermined distance in the first direction, thereby to address stripe regions or rows of the target surface that correspond to rows of display locations. This is accomplished by applying voltages of appropriate character to corresponding ones of multiple deflection plates that extend in a second direction across a back inner surface of the display panel. Since the electron beam is substantially as wide as the target surface, all column positions of the display locations in a row are addressed simultaneously, and the data drive signals for the row are applied to the column electrodes in parallel. The first and second directions preferably align with the vertical and horizontal directions, respectively.

An electron-transparent reference potential electrode is positioned over and in substantially parallel spaced-apart relation to the target surface. The electron beam is directed through the reference potential electrode and toward the stripe regions on the target surface the electron beam addresses to stimulate emission of secondary electrons from the regions. The reference potential electrode is fixed at a substantially constant reference voltage and collects the secondary electrons emitted from the addressed stripe regions, thereby developing the reference voltages on the addressed regions of the target surface.

In the display panel of the first embodiment, a layer of material having electro-optical properties is positioned between the inner surfaces of the first and second substrates. The display locations are defined by the overlapping areas of the column electrodes and the stripe regions of the target surface addressed by the electron beam. The display locations appear as spots on the display screen. The spots are sufficiently small and positioned close to one another so that they are indistinguishable by an observer during normal viewing conditions.

The electric fields formed by adjacent ones of the deflection plates cooperate to focus the electron beam in the vertical direction, and the widths of the column electrodes define the display resolution in the horizontal second direction. Accordingly, the focusing effects of the deflection plates cooperate with column electrodes of narrow widths to provide the display panel with a relatively high resolution that is independent of the focusing effects of the beam-emitting electron gun.

The display panel is configured as described above so that for each display location, the secondary electrons emitted from the target surface function as an electrical switch that changes between a conducting state when the electron beam causes emission of the secondary electrons and a nonconducting state in the absence of the electron beam. The magnitude of the data drive signal on the column electrodes corresponds to the luminance of a display image.

Whenever they are in the conducting state, the electrical switches allow data voltages of magnitudes representing of the data drive signals to develop across the liquid crystal material at locations spatially aligned with the overlapping areas of the column electrodes and the stripe region addressed by the electron beam. Whenever they change to the nonconducting state, the electrical switches allow the spatially aligned liquid crystal material to hold the data voltages across it for a time. The electrical switches (i.e.. the secondary electrons) function, therefore, to select and store data across the liquid crystal material.

Light transmission through a display location is modulated in accordance with the magnitude of the data drive signal applied to the location when it is addressed by the electron beam. A monochrome or black-and-white display system with gray scale luminance qualities can be implemented with the use of the present invention. A full color display system with controllable color intensity can be implemented by positioning within the black-and-white display system a color filter containing groups of spots in three primary colors spatially aligned with the display locations. A group of three display locations spatially aligned with a group of three spots would, therefore, represent one image pixel whose color is determined by the relative intensities of the spots in the group.

The display system of the present invention is capable of rendering fully dynamic, gray scale images over a broad range of field rates to provide a high contrast display. The display system is capable of addressing thousands of lines of data at 60 Hz field rates and providing a wide range of viewing angles.

In the memory device of the second embodiment, the second substrate functions as the layer of dielectric material. The memory locations are defined by the overlapping areas of the column electrodes and the stripe regions of the target surface addressed by the electron beam. The memory device is configured as described above so that for each memory location, the secondary electrons function as an electrical switch that changes between the conducting state and the nonconducting state. Amplifiers providing the data drive signals are configured as column electrode drive amplifiers in a data write mode and as column electrode sensing amplifiers in a data read mode. Since the electron beam is substantially as wide as the target surface, all of the memory locations in a row of data are addressed simultaneously, and the amplifiers write and read in parallel the data voltages in a row of data.

Whenever they are in the conducting state, the electrical switches allow data voltages of magnitudes representing those of data drive signals to develop across the dielectric material at locations spatially aligned with the overlapping areas of the stripe region addressed by the electron beam and the column electrodes. This represents the data write mode of the memory device.

Whenever they change to the nonconducting state, the electrical switches allow the spatially aligned dielectric material to hold the data voltages across it for a time. The column electrode sensing amplifiers associated with the locations in a row apply a reference voltage to the column electrodes spatially aligned with the stripe region of the target surface being addressed by the electron beam. Whenever they return to the conducting state, the electrical switches cause changes in the voltages across the dielectric material which changes are proportional to the previously written data voltages and appear at the outputs of the column electrode sensing amplifiers. This represents the data read mode of the memory device.

Certain modifications of the addressing structure described above could facilitate other means for applying the data voltage to the memory locations of the memory device. For example, substituting a photoconductive material for the dielectric material and using column electrodes having optically transparent properties would permit incident light to modulate the magnitude of the data voltages applied to the memory locations in proportion to the intensity of incident light. Such an addressing structure could be implemented as part of an image sensing device or optical processing device.

Additional objects and advantages of the present invention will be apparent from the detailed description of preferred embodiments thereof, which proceeds with reference to the accompanying drawings.

BRIEF DESCRIPTION OF THE DRAWINGS

FIG. 3 is a schematic isometric view with a portion broken away showing a display system employing an addressing apparatus in accordance with the present invention.

FIG. 4 is a fragmentary isometric view with portions broken away that shows different depthwise views of the interior of the display system of FIG. 3.

FIGS. 8A and 8B are diagrams of alternative electronic circuit designs of the data driver shown in FIG. 4.

FIGS. 9A and 9B are diagrams of alternative column electrode wiring configurations that illustrate a technique for reducing the required number of outputs of the data driver of FIG. 4.

FIG. 10 is a schematic isometric view with a portion broken away showing a display system employing an alternative addressing apparatus in accordance with the present invention.

FIG. 11 is an exploded schematic isometric view of the cathode and segmented control grid of the addressing apparatus of FIG. 10.

DETAILED DESCRIPTION OF PREFERRED EMBODIMENTS

Figure 1:
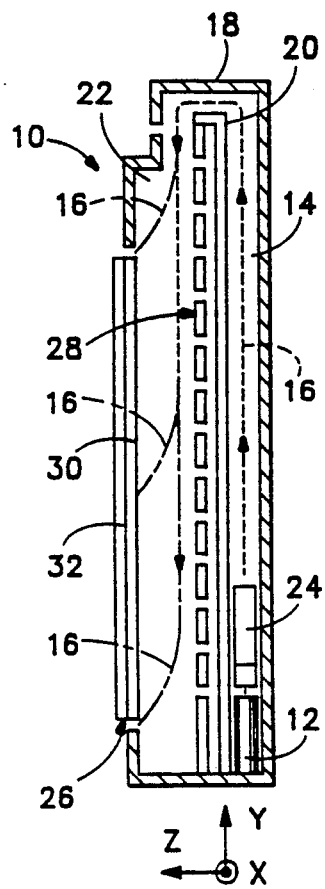
FIG. 1 is a cross sectional view of a prior art display system having an addressing apparatus that employs a raster-scanned electron beam.
Figure 2:
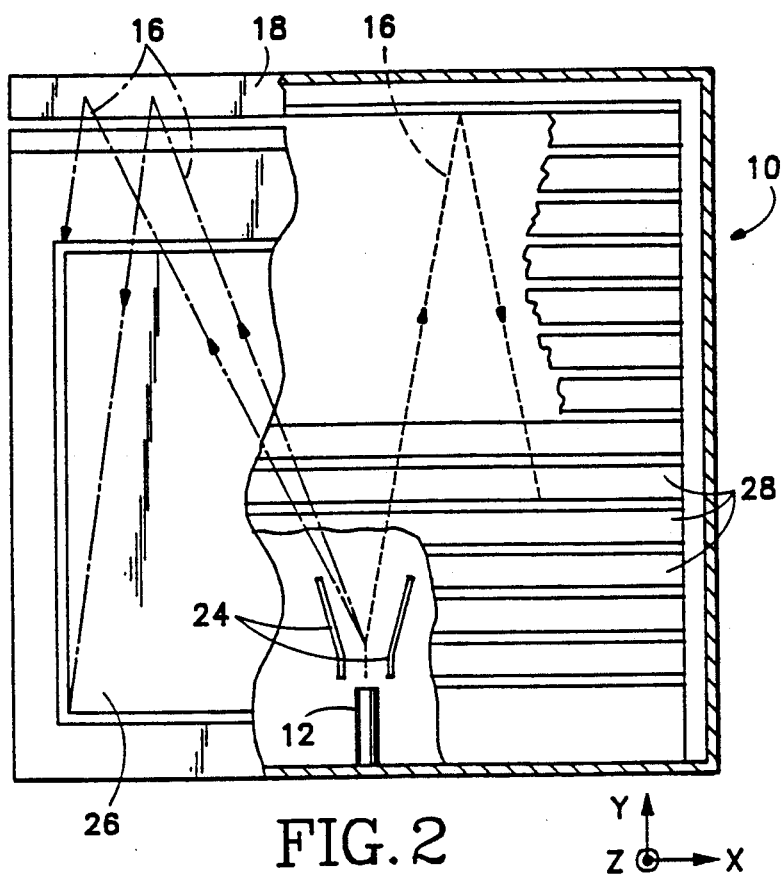
FIG. 2 is a frontal view with portions broken away showing the display panel of the prior art display system of FIG. 1.

FIG. 3 is an isometric view of a portion of a light-reflective display system 40, which represents a first embodiment that implements the addressing structure and carries out the addressing method of the present invention.

With reference to FIG. 3, display system 40 comprises an evacuated envelope 42 that includes an optically opaque, electrically nonconductive back substrate 44 secured in opposed relation to an optically transparent, electrically nonconductive display substrate 46 by four peripheral support structures 47 (one broken away to show the interior of envelope 42). Display system 40 includes an internal liquid crystal cell 48 (enlarged in FIG. 3 for clarity) that is disposed in the path of light rays 50 incident to the outer major surface 51 of display substrate 46. Cell 48 comprises a layer 52 of liquid crystal material captured between display substrate 46 and a thin, optically transparent target substrate 54 having a target surface 56 and a dielectric mirror 57.

Target substrate 54 is formed of a suitable dielectric material such as glass, a polyimide, or mica. Target substrate 54 can be coated with a layer of magnesium oxide (MgO) as described in U.S. Pat. No. 4,744,636 of Haven et al., Electron Beam-Addressed Liquid Crystal Cell. The MgO coating provides a relatively high secondary electron emission ratio. Display substrate 46 and back substrate 44 are sealed along their side margins to support structures 47 with ceramic frit seals or other suitable material. The cell may be assembled with the target substrate stretched over a plurality of spacers 60 of substantially uniform height, in the manner described in copending U.S. patent application Ser. No. 07/046,826 of Chitwood et al., filed May 5, 1987, for Liquid Crystal Cell and Method of Assembly of Same. The resulting tension stresses in the target substrate 54 secure the substrate in place so that the liquid crystal cell 48 will maintain a uniform thickness.

Multiple optically transparent thin, narrow, nonoverlapping electrodes 62 (only four shown and enlarged for clarity in FIG. 3) formed of indium tin oxide (ITO) are arranged in vertical columns on the inner major surface of display substrate 46. (The electrodes 62 are hereinafter referred to as "column electrodes 62.")

Positioned at one end of envelope 42 is an addressing electron emitting means or gun 70 that includes a linear cathode 72 and multiple electrodes 74 that function as multiple cylindrical electron lenses for forming a row-scanning or "ribbon" electron beam 76 that is directed along a path that is substantially parallel to target substrate 54 of liquid crystal cell 48. Electron beam 76 is of substantially constant beam current and is scanned in a row scan fashion along the length of target surface 56 in the vertical direction in response to suitable electrical signals supplied by deflection circuitry (not shown) to successive ones of multiple electrostatic deflection plates 78 positioned on the inner major surface of back substrate 44, as will be described below in greater detail.

Gun 70 is operated so that the electrons in beam 76 strike target surface 56 with an energy that causes the emission of secondary electrons with a secondary electron ratio of greater than 1. The secondary electron emission ratio is defined as the number of electrons emitted by target surface 56 for each incident electron striking target surface 56.

FIG. 4 shows that display substrate 46 contains a pattern of pixels formed by a rectangular planar array of nominally identical data storage or display locations 80 mutually spaced apart by predetermined distances in the vertical and horizontal directions. Each display location 80 in the array represents the overlapping portions of column electrodes 62 arranged in vertical columns and the regions of target substrate 54 over which electron beam 76 is scanned. Electron beam 76 is scanned in a direction 81 and strikes stripe regions 82 (one shown) on target surface 56 to effect row-by-row scanning of display locations 80. The display locations 80 in each row addressed by electron beam 76 represent one line of data.

The widths of column electrodes 62 determine the horizontal dimensions of display locations 80, and the vertical width of electron beam 76 determines the vertical dimensions of display locations 80. Accordingly, electron beam 76 may extend continuously across target surface 56 in the horizontal direction and provide row-by-row addressing of complete lines without affecting the horizontal resolution of display system 40. Electron beam 76 is focused in the vertical direction by cooperation between the deflection plates 78, thereby providing display system 40 with a high resolution in the vertical direction. Since it is effected by deflection plates 78, the vertical focusing of electron beam 76 is substantially uniform over the entire surface of target substrate 54.

Column electrodes 62 receive data drive signals of the analog voltage type developed on parallel output conductors 84 by different ones of the output amplifiers 86 of a data drive means or circuit 88. The data drive signals correspond to video or other input signals that are applied to column electrodes 62 to modulate the potential differences established across liquid crystal cell 48 in accordance with the video image to be rendered on display surface 46. Electron beam 76 addresses display locations 80 in cooperation with a substantially electron transparent reference potential electrode 90 (FIG. 3, omitted from FIG. 4 for clarity) that is positioned over and in substantially parallel spaced-apart relation to target surface 56.

Figure 5:
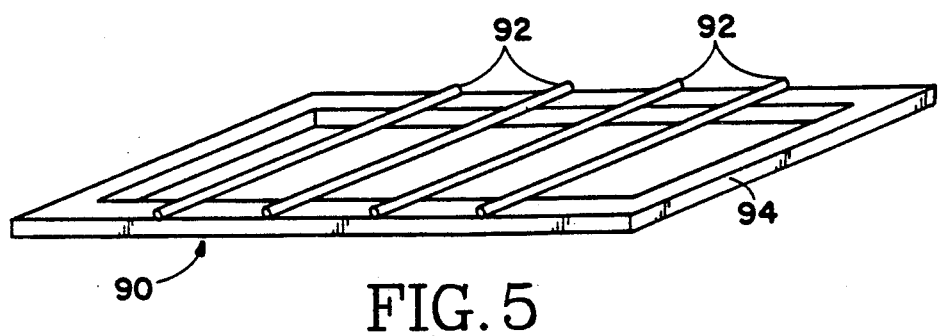
FIG. 5 is a schematic isometric view of a reference electrode employed in the display system of FIG. 3.

Reference electrode 90 is electrically connected to ground and comprises, for example, a grid of parallel wire segments aligned transverse to column electrodes 62 and formed by attaching segments of wire 92 of about five microns in diameter to a frame 94, as shown in FIG. 5. Alternatively, the grid may be constructed of crossed wire sigments that form a mesh configuration. Electron beam 76 is directed through reference electrode 90 and toward target surface 56.

To synthesize an image on the entire area of display surface 46, display system 40 employs a scan control circuit 96 that coordinates the functions of data driver 88 and deflection plates 78 so that all columns of display locations 80 of display system 40 are simultaneously addressed by electron beam 76 row by row in row scan fashion. Display system 40 may employ electro-optic materials of different types such as the light-scattering encapsulated nematic liquid crystal materials. It will be appreciated that such an electro-optic material in reflective display system 40 provides modulation of light intensity without the placement of polarizing filters in the path of the incident light rays 50.

Figure 6:
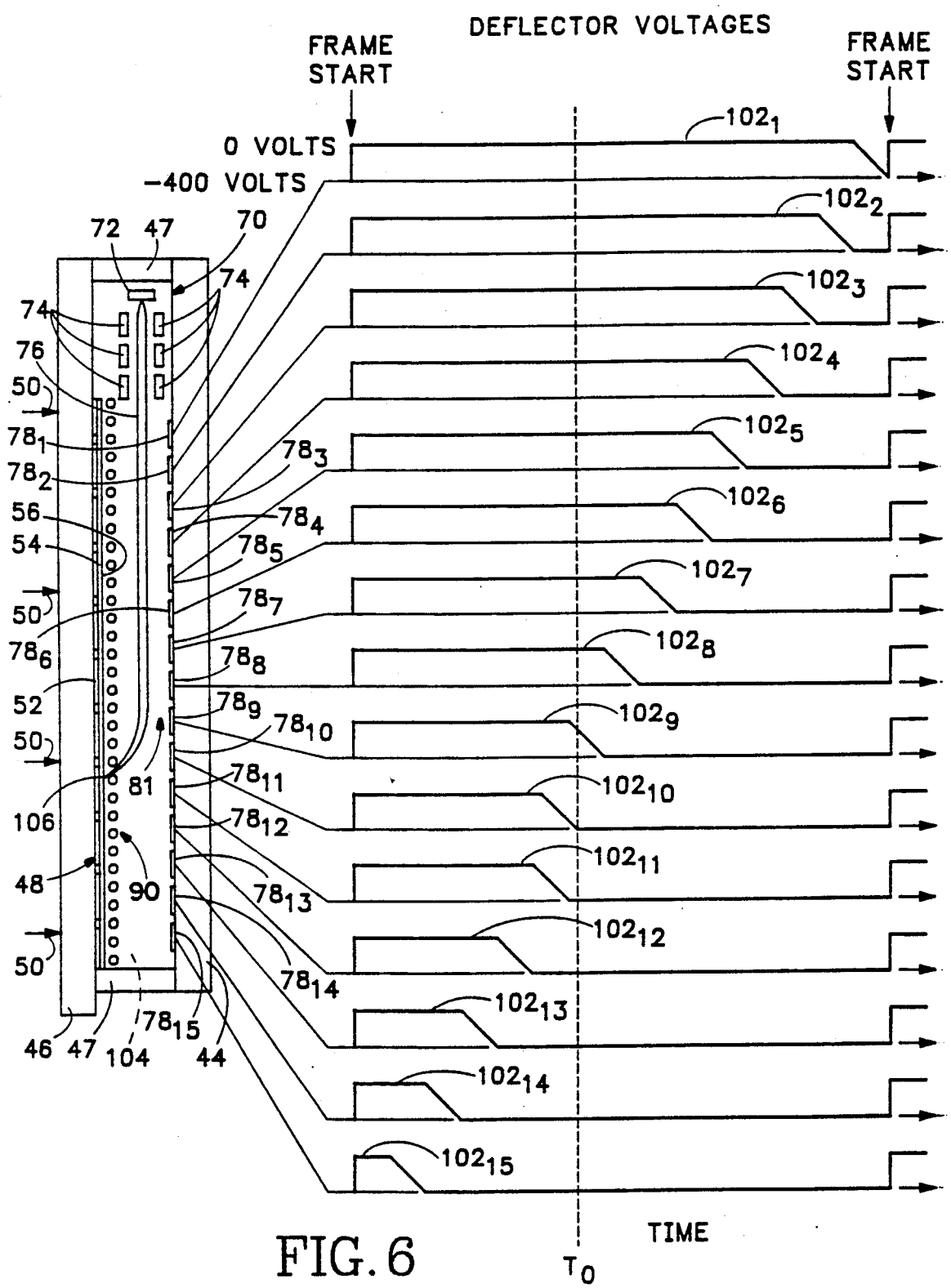
FIG. 6 is a cross sectional view of the display system of FIG. 3 with an associated timing diagram showing the signals applied to the different deflection electrodes in the system.

FIG. 6 shows in combination a cross sectional view of display system 40 and an associated timing diagram of the deflection signals applied to different ones of the deflection plates 78. In particular, row-scanning signals $102_1$–$102_{15}$ are applied to respective deflection plates $78_1$–$78_{15}$ during an image frame to effect a row-by-row scanning of target surface 56 by electron beam 76 in the manner described below.

At the start of an image frame, all of deflection plates $78_1$–$78_{15}$ receive a potential of about 0 volts. This potential and the 0 volt potential on reference electrode 90 cooperate to form an electric field-free region between reference electrode 90 and deflection plates $78_1$–$78_{15}$. As a consequence, electron beam 76 propagates along a path 104 extending the entire length of and substantially parallel to target surface 56.

During the image frame, successive ones of the respective row-scanning signals $102_{15}$–$102_1$ ramp down to a potential of −400 volts and thereby deflect electron beam 76 to strike successive stripe regions of target surface 56. The respective row-scanning signals $102_{15}$–$102_1$ cooperate to smoothly scan electron beam 76 along target surface 56 in direction 81 to effect row-by-row scanning of the display locations 80 (FIG. 4) aligned with column electrodes 62. The deflection of electron beam 76 is described in greater detail with reference to the following example.

At an exemplary time $t_0$ during an image frame period, electron beam 76 strikes target surface 56 at a row-scan position 106. At the time $t_0$, deflection plates $78_1$–$78_8$ receive respective row-scanning signals $102_1$–$102_8$ which are at a potential of 0 volts and cooperate with reference electrode 90 to generate an electric-field free region. Electron beam 76 propogates, therefore, along path 104 in the region aligned with deflection plates $78_1$–$78_8$. Electron beam is deflected to strike target surface 56 at position 106 by a potential of about −400 volts applied to deflection plate $78_{10}$–$78_{15}$ and a potential of about −100 volts (i.e., the upper part of the ramp voltage portion of row-scanning signal $102_9$) applied to deflection plate $78_9$. As the image frame proceeds beyond time $t_0$, the magnitude of the ramp voltage portion of timing signal $102_9$ decreases and position 106 at which electron beam 76 strikes target surface 56 moves upward in direction 81.

For a transmissive mode of operation (e.g., for a projection-type display system), the display system could employ a twisted nematic liquid crystal as the electro-optic material. In such a system, both the display and back substrates would be optically transparent as would the deflection plates 78. A first light polarizing filter would be positioned outside the display surface, and a second polarizing filter would be positioned outside the back substrate. As a result, light transmitted through the polarizing filters and the transmissive display system would be intensity modulated in accordance with the video voltages established across the display locations.

Figure 7:
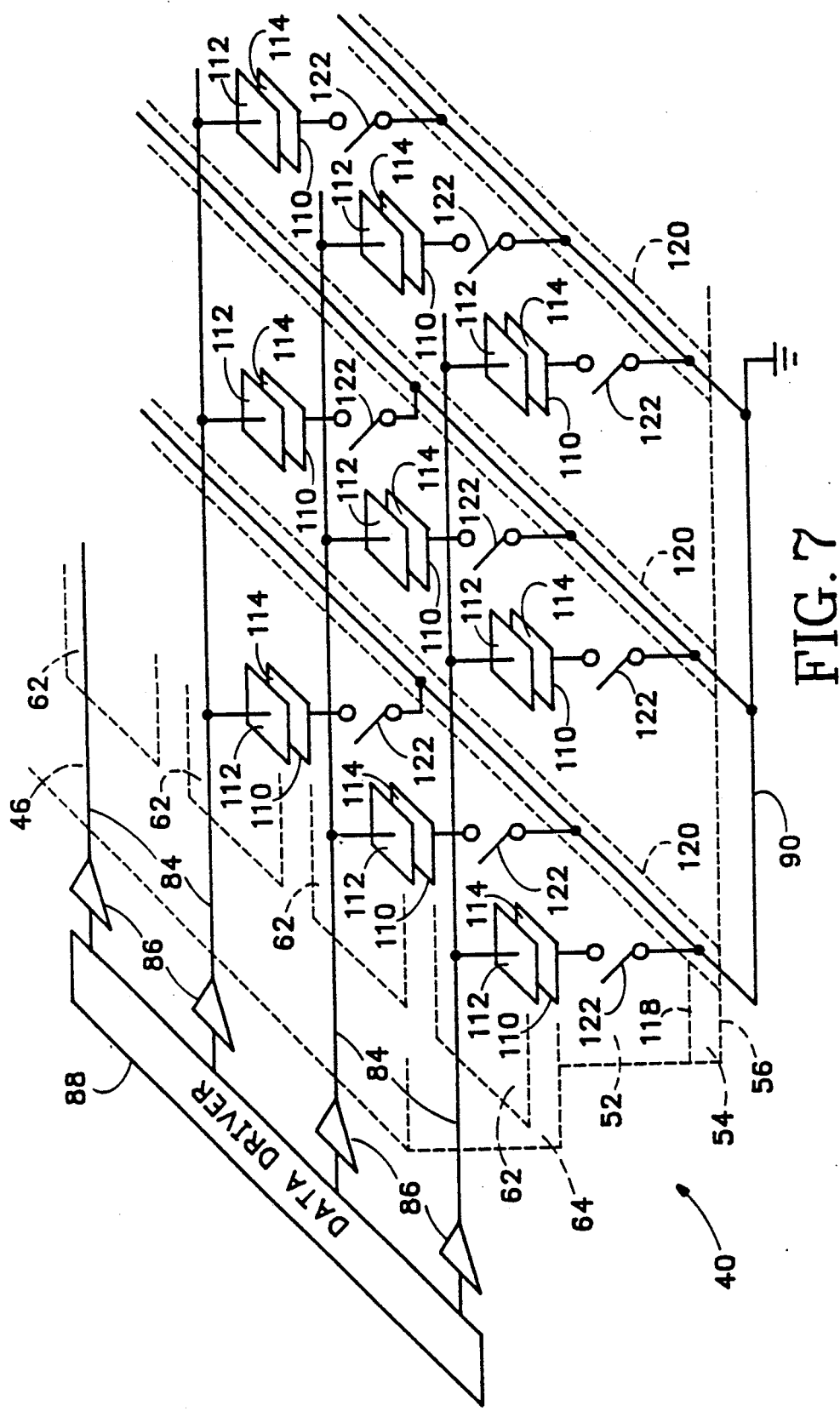
FIG. 7 is an equivalent circuit diagram showing for the display system of FIG. 3 the operation of the secondary electrons as switches for an exemplary row being addressed by the electron beam and three exemplary data columns receiving data drive signals.

The principles underlying the operation of display system 40 are that 1) each of its display locations 80 functions as a sampling capacitor for analog voltage data applied to the column electrode 62 forming a part of the display location and 2) the secondary electrons emitted from target substsrate 54 when it is struck by electron beam 76 function to close a sampling switch. FIG. 7 is an equivalent circuit to which the following explanation of the operation of display system 40 refers.

With reference to FIG. 7, each of display locations 80 of display system 40 can be modeled as a capacitor 110 (hereinafter "capacitor model 110"), whose top plate 112 represents one of the column electrodes 62 and whose bottom plate 114 represents the target surface 56. Capacitor model 110 represents the capacitive liquid crystal cell formed by an overlapping region of a column electrode 62 and a row 120 addressed by electron beam 76. The description herein of the operation of display system 40 refers to the capacitor model 110.

In accordance with the basic addressing procedure, data driver 88 captures a first line of data, which represents discrete samples of the time-varying voltage of the analog data signal in a time interval of predetermined duration. The sample of the magnitude of the data signal at a particular instance within the time interval represents the magnitude of the analog voltage applied to a capacitor model 110 in a corresponding column position of a row 120 addressed by electron beam 76. Data driver 88 develops on its output amplifiers 86 the analog voltages that are applied to column electrodes 62.

In FIG. 7, four exemplary output amplifiers 86 of data driver 88 simultaneously deliver analog voltages of positive polarity to the respective ones of column electrodes 62 to which they are connected. The application of a positive voltage on a column electrode 62 induces on target surface 56 a voltage that is essentially equal to the magnitude of the applied voltage. This causes no change in the potential difference across capacitor model 110 and is represented in FIG. 7 by a top plate 112 and a bottom plate 114 with white surfaces.

At this instance, no secondary electrons are being emitted from target substrate 54, and the analog voltage developed on plates 112 and 114 of capacitor model 110 is positive with respect to the ground voltage on reference potential electrode 90. Whenever electron beam 76 addresses a stripe region or row on target surface 56, secondary electrons are emitted therefrom. The row 120 addressed by electron beam 76 is represented in FIG. 7 by dark, thick dashed lines.

The incident and secondary electrons neutralize the induced positive voltage on the bottom plates 114 of capacitor models 110. The capacitor models 110 in the addressed row 120 are charged with the data voltages applied across them. This condition is indicated in FIG. 7 by top plates 112 with white surfaces and bottom plates 114 with lined surfaces.

Each of the rows 120 of display locations 80 is addressed by electron beam 76 in a similar manner until the entire display surface 36 is completely addressed and thereby stores an image field of data. The voltage remains stored across each of the capacitor models 110 in the addressed row 120 for a time at least as long as the duration of the image field and is independent of subsequent changes in data voltage applied to top plate 112 of capacitor model 110. The voltage stored across each of the capacitor models 110 changes in accordance with the analog data voltages representing the display data of the next succeeding image field.

The description presented above indicates that the action of the incident and secondary electrons generated by electron beam 76 operate as an electrical switch 122 whose contact position changes between binary switching states. The switches 122 shown in FIG. 7 in the closed position are electrically connected to reference electrode 90 by the action of the secondary electrons emitted from target substrate 54, such that the corresponding display locations 80 are in a conducting state. The absence of the secondary electrons causes a display location 80 to be in a nonconducting state. The switches 122 shown in FIG. 7 in the open position are not electrically connected to reference electrode 90. In FIG. 7, the row 120 shown in the middle of the three rows of capacitor models 110 is addressed by electron beam 76 to establish and store the display data voltages across them.

To function as a switch, the secondary electrons provide an electrically conductive path from target substrate 54 to reference electrode 90. The secondary electrons emitted along a row 120 addressed by electron beam 76 provide a ground path to the capacitor model 110 representing the portion of liquid crystal material positioned adjacent the addressed row. This allows the row 120 to be stabilized at the reference potential (i.e. 0 volts) so that capacitor models 110 can sample the analog data voltages applied to column electrodes 62. Absence of the electron beam 76 and the secondary electrons acts to remove the conducting path, thereby allowing the data sample to be held across the display location 80 (FIG. 4). The voltages remain stored across liquid crystal cell 48 until voltages representing a new line of data in a subsequent image field are developed across the cell 48, or until the sampled voltages are erased in an "erase field." The above-described addressing structure and technique provide signals of essentially 100% duty cycle to every one of the display locations 80.

Display system 40 may be configured to employ image fields that are in a noninterlaced format or an interlaced format. In a display system 40 whose image fields are in a noninterlaced format, the analog data voltages applied to column electrodes 62 in the next succeeding image field are of opposite polarity. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produced is, therefore, unaffected by alternate changes in polarity of the analog voltage data.

Display system 40 preferably is configured to employ image fields arranged in an interlaced format. The reasons are that the rows 120 addressed by electron beam 76 are positioned close together and that the secondary electrons emitted from a row 120 in a noninterlaced format can alter the video data stored on adjacent rows. In a multiple interlace format, the successive rows 120 addressed in an image field are separated by a number of rows 120 that equals the number of image fields per image frame. For example, each image frame could comprise four image fields of which each image field comprises one-fourth the number of addressable rows. The number of image fields per image frame is selected so that the distance between successively addressed rows in an image field is much greater than the distance between target surface 56 and reference electrode 90.

Since the liquid crystal material is responsive to the rms value of the applied analog voltage data, the relatively short period of time during which voltage data is present on a column electrode 62 is compensated for by slightly increasing the magnitude of the data voltage. To achieve a long term zero voltage component in such a system, the analog data voltages applied to column electrodes 62 in successive image frames are of opposite polarity. Alternatively, all of the image fields are of positive polarity but are erased by "erase fields," one of which occurs after each image field.

FIGS. 8A and 8B show alternative circuit designs for the data drivers 88$a$ and 88$b$ whose corresponding components are identified by identical reference numerals with the suffixes "a" and "b", respectively.

With reference to FIG. 8A, data driver 88$a$ samples the data signal and stores it in a buffer memory 126. The data signal can be in analog or digital form. Buffer memory 126 can be of the charge-coupled device (CCD) type or the sample-and-hold type to store an analog data signal, and buffer memory 126 can be of the digital type to store a digital data signal. The devices 86 represent either buffer amplifiers or digital-to-analog converters, depending on whether buffer memory 126 holds analog voltages or digital data, respectively. Devices 86 permit the parallel transfer of analog voltages to column electrodes 62$a$. Data driver 88$a$ is capable of high-speed operation because CCD and sample-and-hold circuits are capable of high-speed acquisition and the analog voltages can be transferred simultaneously in parallel to the column electrodes 62$a$.

With reference to FIG. 8B, data driver 88$b$ samples the analog data signal in serial fashion by sequentially closing and opening one at a time different ones of a set of switches 128. Each of the switches 128 is connected to a capacitor 130. The capacitors 130 accumulate charge from the data signal when the switch is closed. This provides analog voltage samples of the data signal to the column electrodes 62$b$ in a row from one end to the other end. A sampling clock signal applied to the control electrodes of switches 128 sets the sampling rate.

FIGS. 9A and 9B compare the number of output amplifiers 86 required for exemplary display systems having nine channels. FIG. 9A shows the display system 40 of FIG. 3 with nine different output amplifiers 86, data driver 88 driving the amplifiers for different single ones of column electrodes 62. FIG. 9B shows an alternative display system 140 (FIGS. 10 and 11) that has three time-multiplexed output amplifiers 86 electrically connected to column electrodes 62 that are grouped in sets 142, 144, and 146 of three electrodes each. Corresponding components of display systems 40 and 140 have identical reference numerals.

With reference to FIGS. 9B, 10, and 11, each row of display locations 80 extending across the three sets 142, 144, and 146 of column electrodes 62 is addressed by a row-scanning electron beam 76' in three successive time intervals $t_1$, $t_2$, and $t_3$, respectively. During time interval $t_1$, for example, display system 140 addresses the ones of the display locations 80 that are in the row and are aligned with the column electrodes 62 in set 142. Electron beam 76' is formed by directing electron beam 76 through a segmented control grid 148 having three electrically separate grid segments 150, 152, and 154 aligned with the respective sets 142, 144, and 146. Grid segment 150 receives an enabling voltage and grid segments 152 and 154 receive a cut-off voltage, thereby forming electron beam 76' over the set 142 of column electrodes 62. Successive rows of display locations 80 on display surface 46 are addressed by successively applying the enabling voltage to the grid segments 150, 152, and 154 during the respective time intervals $t_1$, $t_2$, and $t_3$ in coordination with the time multiplexing of output amplifiers 86.

The configuration of electrical connections of the output amplifiers 86 shown in FIG. 9B provides an addressing structure that requires fewer output amplifiers 86 than the number required by the addressing structure shown in FIG. 9A. In the exemplary display systems 40 of FIGS. 9A and 9B, the number of data output amplifiers 86 is reduced from nine to three, respectively. However, output amplifiers 86 of data driver 88 shown in FIG. 9B must be operated at a signal bandwidth that is three times greater than the signal bandwidth at which output amplifiers of FIG. 9A may be operated. Such an inverse relationship between the number of output amplifiers 86 and their signal bandwidths provides a design flexibility in which optimal system performance can be obtained while system cost is reduced.

Display system 40 can be modified to form a versatile analog data memory system 160 that contains an array of memory locations and that represents a second embodiment that implements the addressing structure and carries out the method of the present invention. Such modifications include the removal of layer 52 of liquid crystal material shown in FIGS. 3, 4, and 7.

Figure 12:
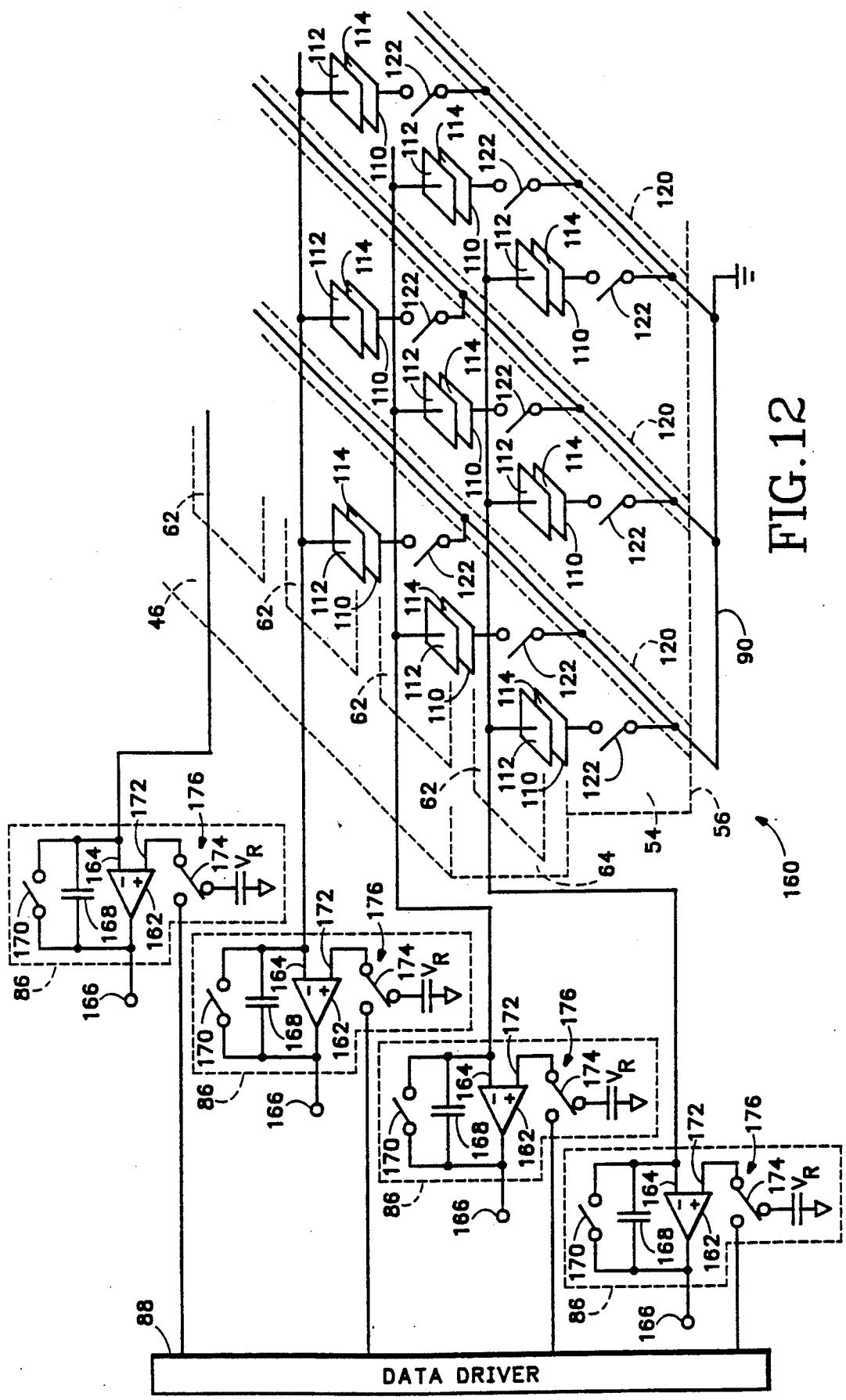
FIG. 12 is an equivalent circuit diagram showing the operation of the secondary electrons as switches in cooperation with the data drive circuit to form an addressing structure for selectively writing data into and reading data out of a memory element.

FIG. 12 shows the equivalent circuit for memory system 160. Except as indicated above, the systems of FIGS. 7 and 12 are similar; therefore, corresponding components in FIGS. 7 and 12 bear identical reference numerals. In memory system 160, target substrate 54 functions as the dielectric element of capacitor model 110, which represents a memory element. It will be appreciated that column electrodes 62 need not be formed of optically transparent material and may advantageously be formed of aluminum or other conductive material. The data drive output amplifiers 86 of memory system 160 comprise circuit elements that function as column electrode drive amplifiers in the data write mode and as column electrode sensing amplifiers in the data read mode. The electron guns 70 of the systems of FIGS. 7 and 12 are similar.

With reference to FIG. 12, each of the output amplifiers 86 of data drive circuit 88 comprises a high-speed operational amplifier 162 that has connected between its inverting input terminal 164 and output terminal 166 a parallel combination including a feedback capacitor 168 and a switch element 170. Amplifier 162 is selectively configured as a voltage follower in the data write mode by actuating switch element 170 to its conducting state and as an integrator in the data read mode by actuating switch element 170 to its nonconducting state. The noninverting input terminal 172 of operational amplifier 162 is connected to the movable contact terminal 174 of a switch element 176, which selectively connects noninverting input terminal 172 to either a reference voltage $V_R$ or an output signal conductor of data drive circuit 88.

Whenever it is in the data write mode, output amplifier 86 delivers a data drive signal to the column electrode 62 forming a memory location in memory system 160. This is accomplished by configuring operational amplifier 162 as a voltage follower and positioning movable contact terminal 174 of switch element 176 to deliver the data drive signal from data drive circuit 88 to noninverting input terminal 172 of operational amplifier 162. During this time, electron beam 76 addresses a row 120 and stimulates emission of secondary electrons from target substrate 54, thereby developing data voltages across capacitor models 110 in the manner described above with reference to FIG. 7. The magnitudes of the voltages across capacitor models 110 represent those of the data drive signals.

Whenever it is in the data read mode, data amplifier 86 senses the current in the column electrode 62 forming the memory location in memory system 160. This is accomplished by means of a two-step process.

First, movable contact terminal 174 of switch element 176 is positioned to deliver voltage reference $V_R$ to noninverting input terminal 172 of operational amplifier 162. During this time, electron beam 76 does not address the row 120, thereby allowing the reference voltage $V_R$ to be established on output terminal 166 of operational amplifier 162, column electrode 62, and upper plate 112 of capacitor model 110. The voltage across feedback capacitor 168 is thereby normalized to 0.0 volts. It will be appreciated, however, that memory system 160 can be configured to operate with an offset voltage between the inputs and outputs of each operational amplifier 162.

Second, after the voltage across feedback capacitor 168 stabilizes to 0.0 volts, operational amplifier 162 is configured as an integrator whose input terminal 164 is prepared to receive the current flowing from column electrode 62. The voltage difference between lower plate 114 of capacitor model 110 and reference electrode 90 is a function of $V_R$ and the previously written data voltage across capacitor model 110. Whenever electron beam 76 addresses a row 120 and stimulates emission of secondary electrons, lower plate 114 of capacitor model 110 is electrically connected to reference electrode 90, thereby changing the voltage across capacitor model 110. Operational amplifier 162, now configured as an integrator, senses this change in voltage and provides on its output terminal 166 a voltage proportional to the data voltage previously developed across capacitor model 110.

There exist other alternatives for developing the data voltage across capacitor model 110 to promote its function as a memory location. For example, substituting photoconductive material for the target substrate 54, using optically transparent column electrodes 62, and exposing memory system 160 to light would modulate the voltages across capacitor models 110 in proportion to the intensity of the light incident on memory system 160. The voltage change developed across capacitor model 110 in response to the intensity of incident light would be restored during the data read mode, as described above. The photoconductive material 54 and optically transparent column electrodes 62 provide, therefore, an image sensing device with analog data memory properties.

In the above-described image sensing device, the construction of target substrate 54 of photoconductive material as multiple electrically isolated strips or discrete islands would avoid conduction between adjacent capacitor models 110. Constructing a strip of metal or other conductive material along the margin of the optically transparent electrodes would increase efficiency of data collection in the data read mode by decreasing the time required to read out the data voltage developed across capacitor models 110.

The above-described image sensing device uses the photoconductive properties of substrate 54 of photoconductive material during the period between the data read modes. It is also possible to make direct use of the photoconductive properties of substrate 54, in which case the storage location 80 might be more properly characterized as a "sensing" element and capacitor model 110 would be more properly depicted as an electrical current modulating device. This can be accomplished by applying to column electrode 62 a voltage that establishes a voltage gradient across substrate 54 during the time electron beam 76 is scanned across a row 120. The electrical current flowing from electron beam 76, through substrate 54 and column electrode 62, to output terminal 166 of operational amplifier 162 would constitute the output signal. Replacing feedback capacitor 168 with a resistor would make the voltage appearing on output terminal 166 of operational amplifier 162 proportional to the current flowing through substrate 54.

It will be obvious to those having skill in the art that many changes may be made in the above-described details of the preferred embodiments of the present invention without departing from the underlying principles thereof. The scope of the present invention should be determined, therefore, only by the following claims.

What is claimed is:

1. An addressable electro-optic system having multiple light pattern data storage locations, comprising:
    first and second substrates having positioned between them a layer of material with electro-optic properties, the first substrate supporting on a major surface thereof plural nonoverlapping first electrodes that extend in a first direction and the second substrate having a target surface;
    first biasing means for applying first electrical signals to different ones of the first electrodes;
    beam emitting means for emitting a row-scanning beam of primary electrons directed along a path substantially parallel to the target surface of the second substrate;
    electron deflecting means spaced apart from the target surface for deflecting the beam of primary electrons to strike the target surface and thereby define on it preselected stripe regions from which secondary electrons are emitted; and
    reference potential stabilizing means cooperating with the secondary electrons emitted from the target surface for developing an electrostatic reference potential at the preselected stripe regions, the simultaneous application of the first electrical signals to the first electrodes and the development of the electrostatic potential at a corresponding preselected stripe region of the target surface changing a property of the electro-optic material.

2. The system of claim 1 in which the second substrate includes an inner surface that is disposed face-to-face and spaced-apart from the major surface of the first substrate and in which the layer of material with electro-optic properties is positioned between the major surface of the first substrate and the inner surface of the second substrate.

3. The system of claim 1 in which the layer of electro-optic material is of the liquid crystal type.

4. The system of claim 3 in which the liquid crystal material is of the nematic type.

5. The system of claim 1 in which the first electrodes are substantially optically transparent over a preselected range of visible wavelengths of light.

6. The system of claim 1 in which the reference potential stabilizing means comprises an electrically conductive grid.

7. The system of claim 6 in which the grid is at a substantially constant potential.

8. The system of claim 1 in which the emitting means emits the beam of primary electrons at a substantially constant beam current.

9. The system of claim 1 in which the number of secondary electrons emitted from the target surface is greater than the number of primary electrons striking the target surface.

10. The system of claim 1 in which the preselected stripe regions extend in a second direction that is transverse to the first direction.

11. The system of claim 10 in which each one of the preselected stripe regions overlaps each one of the first electrodes.

12. The system of claim 1 in which the changes in the property of the electro-optic material is a function of the magnitudes of the first electrical signals.

13. The system of claim 1 in which the path along which the beam of primary electrons is directed extends in the first direction.

14. A method of simultaneously addressing multiple storage locations for optical data, the storage locations including a dielectric substrate in communication with a first major surface of a layer of material having electro-optic properties, comprising:
    defining multiple first stripe regions on a second major surface of the layer and multiple second stripe regions on the dielectric substrate, the storage locations being defined by overlapping portions of the first and second stripe regions;
    inducing on the first stripe regions of the second major surface of the layer signals corresponding to the optical data; and
    simultaneously effecting emission of electrons from the second stripe regions of the dielectric substrate to develop an electrostatic reference potential on the second stripe regions, thereby to change a property of the layer of electro-optic material in accordance with the optical data and effect storage of the signals by the storage locations.

15. The method of claim 14 in which the second stripe regions are transverse to the first stripe regions.

16. The method of claim 14 in which the layer of electro-optic material is of the liquid crystal type.

17. The method of claim 14, further comprising positioning the storage locations to receive incident light propagating from a light source and thereby change the transmissivity of the incident light by an amount corresponding to the optical data.

18. The method of claim 14, further comprising positioning a color filter in optical association with the storage locations to receive incident light propagating from a light source and thereby impart a color value to the incident light of an amount corresponding to the optical data.

19. In an electro-optic system having multiple light pattern data storage locations, an addressing structure for addressing the data storage locations, comprising:
    substrate means having first and second major surfaces for supporting on the first major surface plural nonoverlapping first electrodes that extend in a first direction;
    first biasing means for applying first electrical signals to different ones of the first electrodes;
    beam emitting means for emitting a row-scanning beam of primary electrons along a path substantially parallel to the second major surface;
    electron deflecting means spaced apart from the second major surface for deflecting the beam of primary electrons to strike the second major surface and thereby define on it preselected stripe regions from which secondary electrons are emitted; and reference potential stabilizing means cooperating with the secondary electrons emitted from the second major surface for developing an electrostatic reference potential at the preselected stripe regions, the simultaneous application of the first electrical signals to the first electrodes and the development of the electrostatic reference potential at a corresponding preselected stripe region of the second major surface changing a property of the electro-optic material.

20. The structure of claim 19 in which the first and second major surfaces are positioned on respective first and second substrates, a layer of material having electro-optic properties is positioned between inner surfaces of the first and second substrates, and the first electrodes are supported on the inner surface of the first substrate.

21. The structure of claim 19 in which the second major surface has a width in a second direction that is transverse to the first direction and in which the beam of primary electrons has a width substantially equal to the width of the second major surface.

22. The structure of claim 19 in which the preselected stripe regions extend in a second direction that is transverse to the first direction.

23. The structure of claim 22 in which the beam of primary electrons strikes stripe regions that overlap each one of the first electrodes.

24. The structure of claim 19 in which the path along which the beam of primary electrons is directed extends in the first direction.

* * * * *